United States Patent
Ge et al.

(10) Patent No.: US 8,322,028 B2
(45) Date of Patent: Dec. 4, 2012

(54) METHOD OF PRODUCING AN ISOLATOR FOR A MICROELECTROMECHANICAL SYSTEM (MEMS) DIE

(75) Inventors: Howard H. Ge, Hacienda Heights, CA (US); A. Dorian Challoner, Manhattan Beach, CA (US)

(73) Assignee: The Boeing Company, Chicago, IL (US)

( * ) Notice: Subject to any disclaimer, the term of this patent is extended or adjusted under 35 U.S.C. 154(b) by 707 days.

(21) Appl. No.: 12/416,894

(22) Filed: Apr. 1, 2009

(65) Prior Publication Data
US 2010/0251817 A1     Oct. 7, 2010

(51) Int. Cl.
*H05K 3/00*     (2006.01)
(52) U.S. Cl. ............... 29/829; 29/825; 29/831; 29/846; 73/504.04; 73/504.12; 73/504.13
(58) Field of Classification Search ............ 29/829, 29/825, 831, 846, 854, 874; 73/504.02, 504.04, 73/504.12, 504.13, 514.32
See application file for complete search history.

(56) References Cited

U.S. PATENT DOCUMENTS

| | | |
|---|---|---|
| 392,650 A | 11/1888 | Watrous |
| 4,898,031 A | 2/1990 | Oikawa et al. |
| 5,203,208 A | 4/1993 | Bernstein |
| 5,226,321 A | 7/1993 | Varnham et al. |
| 5,421,312 A | 6/1995 | Dawson |
| 5,578,976 A | 11/1996 | Yao et al. |
| 5,646,346 A | 7/1997 | Okada |
| 5,665,915 A | 9/1997 | Kobayashi et al. |
| 5,728,936 A | 3/1998 | Lutz |
| 5,783,749 A | 7/1998 | Lee et al. |
| 5,894,090 A | 4/1999 | Tang et al. |
| 5,905,202 A | 5/1999 | Kubena et al. |
| 5,920,012 A | 7/1999 | Pinson |
| 5,987,985 A | 11/1999 | Okada |
| 6,009,751 A | 1/2000 | Ljung |

(Continued)

FOREIGN PATENT DOCUMENTS

DE     44 42 033 A1     5/1996

(Continued)

OTHER PUBLICATIONS

Wright et al., "The HRG Applied to a Satellite Attitude Reference System," Guidance and Control, AASAAS, 1994, 86:1-13.

(Continued)

*Primary Examiner* — Thiem Phan
(74) *Attorney, Agent, or Firm* — Canady & Lortz LLP; Bradley K. Lortz

(57) ABSTRACT

A single layer micromachined thermal and mechanical isolator may be bonded between a microelectromechanical system (MEMS) die and package. Small bond pads of the isolator are attached to the periphery of the die. The isolator material may be chosen to match that of the die, reducing CTE mismatch. Long thin isolation beams can be used to provide thermal isolation against external temperature changes, which may be conducted through the package. Weak and flexible beams can be used to tolerate large displacements with very little resistance. Thus, excessive stress or distortion to the package, from either CTE mismatch or external stress, may be absorbed by the isolator and will not be transmitted to the MEMS die. Beam rigidity may be designed to attenuate vibration of particular frequency range. The isolator can be readily inserted into an existing disc resonator gyroscope package in one thermal compression bond step.

10 Claims, 7 Drawing Sheets

U.S. PATENT DOCUMENTS

| | | | |
|---|---|---|---|
| 6,044,705 A | 4/2000 | Neukermans et al. | |
| 6,094,984 A | 8/2000 | Asano et al. | |
| 6,145,380 A | 11/2000 | Macgugan et al. | |
| 6,151,964 A | 11/2000 | Nakajima | |
| 6,164,134 A | 12/2000 | Cargille | |
| 6,182,352 B1 | 2/2001 | Deschenes et al. | |
| 6,263,552 B1 | 7/2001 | Takeuchi et al. | |
| 6,282,958 B1 | 9/2001 | Fell et al. | |
| 6,289,733 B1 | 9/2001 | Challoner et al. | |
| 6,360,601 B1 | 3/2002 | Challoner et al. | |
| 6,367,786 B1 | 4/2002 | Gutierrez et al. | |
| 6,481,284 B2 | 11/2002 | Geen et al. | |
| 6,481,285 B1 | 11/2002 | Shkel et al. | |
| 6,515,278 B2 | 2/2003 | Wine et al. | |
| 6,629,460 B2 | 10/2003 | Challoner | |
| 6,944,931 B2 | 9/2005 | Shcheglov et al. | |
| 7,040,163 B2 | 5/2006 | Shcheglov et al. | |
| 7,168,318 B2 | 1/2007 | Challoner et al. | |
| 7,401,397 B2 | 7/2008 | Shcheglov et al. | |
| 7,581,443 B2 * | 9/2009 | Kubena et al. | 73/504.12 |
| 7,818,871 B2 * | 10/2010 | Shcheglov | 29/592.1 |
| 2002/0066317 A1 | 6/2002 | Lin | |
| 2003/0010123 A1 | 1/2003 | Malvern et al. | |
| 2003/0029238 A1 | 2/2003 | Challoner | |
| 2004/0055380 A1 | 3/2004 | Shcheglov et al. | |
| 2005/0017329 A1 | 1/2005 | Hayworth et al. | |
| 2005/0274183 A1 | 12/2005 | Shcheglov et al. | |
| 2006/0162146 A1 | 7/2006 | Shcheglov et al. | |
| 2007/0084042 A1 | 4/2007 | Challoner et al. | |
| 2008/0295622 A1 | 12/2008 | Challoner | |

FOREIGN PATENT DOCUMENTS

| | | |
|---|---|---|
| DE | 19719601 A1 | 11/1998 |
| EP | 0 461 761 A1 | 12/1991 |
| EP | 1055908 A1 | 11/2000 |
| EP | 0 971 208 A2 | 12/2000 |
| JP | 01129517 A | 5/1989 |
| WO | WO 96/38710 | 12/1996 |
| WO | WO 98/15799 | 4/1998 |
| WO | WO 00/68640 | 11/2000 |
| WO | WO 01/44823 A | 6/2001 |
| WO | WO 01/74708 A | 10/2001 |

OTHER PUBLICATIONS

Putty et al., "A Micromachined Vibrating Ring Gyroscope," Solid State Sensor and Actuator Workshop, Transducer Research Foundation, Hilton Head, 1994, pp. 213-220.

Tang et al., "A Packaged Silicon MEMS Vibratory Gyroscope for Microspacecraft," Proceedings IEEE, 10th Annual Int. Workshop on MEMS, Japan, 1997, pp. 500-505.

Barbour et al., "Micromechanical Silicon Instrument and Systems Development at Draper Laboratory," AIAA Guidance Navigation and Control Conference, 1996, Paper No. 96-3709.

Johnson et al., "Surface Micromachined Angular Rate Sensor," A1995 SAE Conference, Paper No. 950538, pp. 77-83.

Fujita et al., "Disk-shaped bulk micromachined gyroscope with vacuum sealing," Sensors and Actuators A:Physical, vol. 82, May 2000, pp. 198-204.

Skulski et al., "Planar resonator sensor for moisture measurements", Microwaves and Radar, 1998, MIKON '98, 12th International Conf., vol. 3, May 20-22, 1998, pp. 692-695.

Pryputniewicz et al., "New Approach to Development of Packaging for MEMS Inertial Sensors," Proceedings of 2001 ASME Int. Mech. Eng. Cong. and Expo., Nov. 11-16, 2001, NY.

* cited by examiner

METHOD OF PRODUCING AN ISOLATOR FOR A MICROELECTROMECHANICAL SYSTEM (MEMS) DIE

CROSS-REFERENCE TO RELATED APPLICATIONS

This application is related to the following co-pending applications, which are all incorporated by reference herein:

U.S. patent application Ser. No. 11/458,911, filed Jul. 20, 2006, and entitled "DISC RESONATOR GYROSCOPES", by Kubena et al.;

U.S. patent application Ser. No. 11/757,395 (Application Publication No. 2008-0295622A1), filed Jun. 4, 2007, and entitled "PLANAR RESONATOR GYROSCOPE WITH CENTRAL DIE ATTACHMENT", by Challoner;

U.S. patent application Ser. No. 11/615,872, filed Dec. 22, 2006, and entitled "VIBRATORY GYROSCOPE WITH PARASITIC MODE DAMPING", by Whelan et al.; and U.S. patent application Ser. No. 11/831,822, filed Jul. 31, 2007, and entitled "DISC RESONATOR INTEGRAL INERTIAL MEASUREMENT UNIT", by Challoner et al.

BACKGROUND OF THE INVENTION

1. Field of the Disclosure

The present disclosure relates to gyroscopes, and in particular to manufacturing disc resonator gyroscopes. More particularly, this invention relates to manufacturing disc resonator gyroscopes with an isolating case.

2. Description of the Related Art

Mechanical gyroscopes are used to determine direction of a moving platform based upon the sensed inertial reaction of an internally moving proof mass. A typical electromechanical gyroscope comprises a suspended proof mass, gyroscope case, pickoffs, or sensors, torquers, or actuators and readout electronics. The inertial proof mass is internally suspended from the gyroscope case that is rigidly mounted to the platform and communicates the inertial motion of the platform while otherwise isolating the proof mass from external disturbances. The pickoffs to sense the internal motion of the proof mass, the torquers to maintain or adjust this motion and the readout electronics that must be in close proximity to the proof mass are internally mounted to the case which also provides the electrical feedthrough connections to the platform electronics and power supply. The case also provides a standard mechanical interface to attach and align the gyroscope with the vehicle platform. In various forms gyroscopes are often employed as a critical sensor for vehicles such as aircraft and spacecraft. They are generally useful for navigation or whenever it is necessary to autonomously determine the orientation of a free object.

Older conventional mechanical gyroscopes were very heavy mechanisms by current standards, employing relatively large spinning masses. A number of recent technologies have brought new forms of gyroscopes, including optical gyroscopes such as laser gyroscopes and fiberoptic gyroscopes as well as mechanical vibratory gyroscopes.

Spacecraft generally depend on inertial rate sensing equipment to supplement attitude control. Currently this is often performed with expensive conventional spinning mass gyros (e.g., a Kearfott inertial reference unit) or conventionally-machined vibratory gyroscopes (e.g. a Litton hemispherical resonator gyroscope inertial reference unit). However, both of these are very expensive, large and heavy.

In addition, although some prior symmetric vibratory gyroscopes have been produced, their vibratory momentum is transferred through the case directly to the vehicle platform. This transfer or coupling admits external disturbances and energy loss indistinguishable from inertial rate input and hence leads to sensing errors and drift. One example of such a vibratory gyroscope may be found in U.S. Pat. No. 5,894,090 to Tang et al. which describes a symmetric cloverleaf vibratory gyroscope design and is hereby incorporated by reference herein. Other planar tuning fork gyroscopes may achieve a degree of isolation of the vibration from the baseplate, however these gyroscopes lack the vibrational symmetry desirable for tuned operation.

In addition, shell mode gyroscopes, such as the hemispherical resonator gyroscope and the vibrating thin ring gyroscope, are known to have some desirable isolation and vibrational symmetry attributes. However, these designs are not suitable for or have significant limitations with thin planar silicon microfabrication. The hemispherical resonator employs the extensive cylindrical sides of the hemisphere for sensitive electrostatic sensors and effective actuators. However its high aspect ratio and 3D curved geometry is unsuitable for inexpensive thin planar silicon microfabrication. The thin ring gyroscope (e.g., U.S. Pat. No. 6,282,958, which is incorporated by reference herein) while suitable for planar silicon microfabrication, lacks electrostatic sensors and actuators that take advantage of the extensive planar area of the device. Moreover, the case for this gyroscope is not of the same material as the resonator proof mass so that the alignment of the pickoffs and torquers relative to the resonator proof mass change with temperature, resulting in gyroscope drift.

Vibration isolation using a low-frequency seismic support of the case or of the resonator, internal to the case is also known (e.g., U.S. Pat. No. 6,009,751, which is incorporated by reference herein). However such increased isolation comes at the expense of proportionately heavier seismic mass and/or lower support frequency. Both effects are undesirable for compact tactical inertial measurement unit (IMU) applications because of proof mass misalignment under acceleration conditions.

More recently, a novel resonator structure comprising a disc using embedded electrostatic electrodes for excitation and sensing has been developed for microgyro applications. In general, the electrodes are formed along with the resonator by through etching a wafer selectively bonded to a baseplate such that the through-etched sidewalls form the capacitive gaps between the electrodes and the resonator and the electrodes and the resonator remain separately bonded to the baseplate. Three-dimensional vibration modes of the disc are excited and sensed to measure angular rate. Some development of such disc resonator gyroscopes (DRG) and applications has already occurred.

However, there is need for improvement of disc resonator gyroscopes (DRG) implementations. For example, coefficient of thermal expansion (CTE) mismatch between the DRG die and the leadless chip carrier (LCC) package can cause temperature sensitivity in existing designs. In addition, residual stress in the device can cause unstable sensor dynamics over time. Furthermore, rigid attachment between DRG die and LCC package can easily transmit stress and vibration, rendering the device too sensitive to ambient conditions. Finally, the proximity of the large bond area to the active sensor element can further impair stress and temperature sensitivity in existing DRG designs.

In view of the foregoing, there is a need in the art for techniques applied to DRGs to make them operate with reduced temperature sensitivity. There is particular need for such techniques for DRGs in space applications. Further, there is a need for such DRGs to be produced with an integral vacuum case. In addition, there is a need for such DRGs with equal or better performance than comparable resonator gyroscopes. As detailed below, the present invention satisfies all these and other needs.

SUMMARY OF THE INVENTION

A single layer micromachined thermal and mechanical isolator may be bonded between a microelectromechanical system (MEMS) die and package. Small bond pads of the isolator are attached to the periphery of the die. The isolator material may be chosen to match that of the die, reducing CTE mismatch. Long thin isolation beams can be used to provide thermal isolation against external temperature changes, which may be conducted through the package. Weak and flexible beams can be used to tolerate large displacements with very little resistance. Thus, excessive stress or distortion to the package, from either CTE mismatch or external stress, may be absorbed by the isolator and will not be transmitted to the MEMS die. Beam rigidity may be designed to attenuate vibration of particular frequency range. The isolator can be readily inserted into an existing disc resonator gyroscope package in one thermal compression bond step.

A typical embodiment of the disclosure comprises a single layer having a central region and a plurality of substantially radial isolation beams, each extending from the central region to a separate radial symmetric pad, a vacuum package bonded to the central region of the single layer, and a microelectromechanical system (MEMS) die bonded to each separate radial symmetric pad at a periphery of the MEMS die. The vacuum package is bonded to a bottom side of the single layer and the MEMS die is bonded to a top side of the single layer.

In further embodiments, each of the plurality of substantially radial isolation beams comprises a plurality of circumferential segments and radial segments connected in series. For example, each of the plurality of substantially radial isolation beams may include three circumferential segments and four radial segments alternately interconnected in series. Some embodiments may employ three substantially radial isolation beams. Beam width of the substantially radial top layer isolation beams may be selected to provide vibration isolation. Typically, the single layer may comprises a silicon or fused silica semiconductor material.

In some embodiments, the MEMS die comprises a disc resonator having embedded electrostatic electrodes having sidewalls that interact with interior sidewalls of the disc resonator such that vibration modes of the disc resonator are driven and sensed with the embedded electrostatic electrodes to measure motion of the disc resonator, and a baseplate having a topside bonded to support the disc resonator and having electrical traces coupled from the embedded electrostatic electrodes and to a baseplate periphery. A bottom side of the baseplate is bonded to the separate radial symmetric pad of each of the plurality of substantially radial isolation beams. The vacuum package may typically include electrical feedthroughs where the electrical feedthroughs are coupled to wire bonds that are coupled in turn to the electrical traces at the baseplate periphery. The vacuum package may include a lid having a getter material activated to assist producing a vacuum within the vacuum package and the lid is bonded to close out the vacuum package.

A typical method embodiment for producing an isolator for a microelectromechanical system (MEMS) die, comprises etching a single layer comprising a central region and a plurality of substantially radial isolation beams, each extending from the central region to a separate radial symmetric pad, bonding a vacuum package to the central region of the single layer at a bottom side of the single layer, and bonding a MEMS die to each separate radial symmetric pad at a periphery of the MEMS die at a top side of the single layer. The method embodiment may be further modified consistent with the apparatus embodiments described herein.

Another embodiment of the disclosure comprises a disc resonator gyroscope including a single layer comprising a central region and a plurality of substantially radial isolation beams, each extending from the central region to a separate radial symmetric pad, a disc resonator having embedded electrostatic electrodes with sidewalls that interact with interior sidewalls of the disc resonator such that vibration modes of the disc resonator are driven and sensed with the embedded electrostatic electrodes to measure motion of the disc resonator, and a baseplate bonded to each separate radial symmetric pad at a periphery of the baseplate at a top side of the single layer, the baseplate bonded to support the disc resonator and having electrical traces coupled from the embedded electrostatic electrodes to a baseplate periphery. A vacuum package may be employed having electrical feedthroughs where the electrical feedthroughs are coupled to wire bonds which are coupled in turn to the electrical traces at the baseplate periphery. A bottom side of the central region of the single layer is bonded to the vacuum package. This embodiment may be further modified consistent with the other apparatus and method embodiments described herein.

Yest another embodiment of the disclosure comprises a disc resonator gyroscope, including a single layer comprising a central region and a plurality of substantially radial isolation beams, each extending from the central region to a separate radial symmetric pad, and a disc resonator means for measuring motion attached to each separate radial symmetric pad of the single layer at a top side of the single layer. This embodiment may also be further modified consistent with the other apparatus and method embodiments described herein.

BRIEF DESCRIPTION OF THE DRAWINGS

Referring now to the drawings in which like reference numbers represent corresponding parts throughout.

DETAILED DESCRIPTION OF THE PREFERRED EMBODIMENT

1. Overview

A thermal and mechanical isolator has been conceived to overcome the deficiencies described above. Embodiments of the present disclosure employ a single layer isolator that can replace the large bond pad of a conventional DRG MEMS die (e.g. as described in FIGS. 1A & 1B in the next section). The isolator may be inserted between the MEMS die and the leadless chip carrier (LCC) package bottom in a known DRG design. As used herein, a MEMS die may be any die that includes MEMS device. For example, a MEMS die may comprise a MEMS device manufacture from a semiconductor material (e.g. silicon) or an insulator (e.g. quartz). The structure of the isolator comprises a single semiconductor layer having a central region and a plurality of substantially radial isolation beams extending therefrom, each to a bond pad arranged in a radial symmetric pattern. The bond pads are bonded to the MEMS die, e.g. a DRG die, and the vacuum package is bonded to the central region of the single layer.

2. Current Disc Resonator Gyroscope and Packaging

Figure 1A:
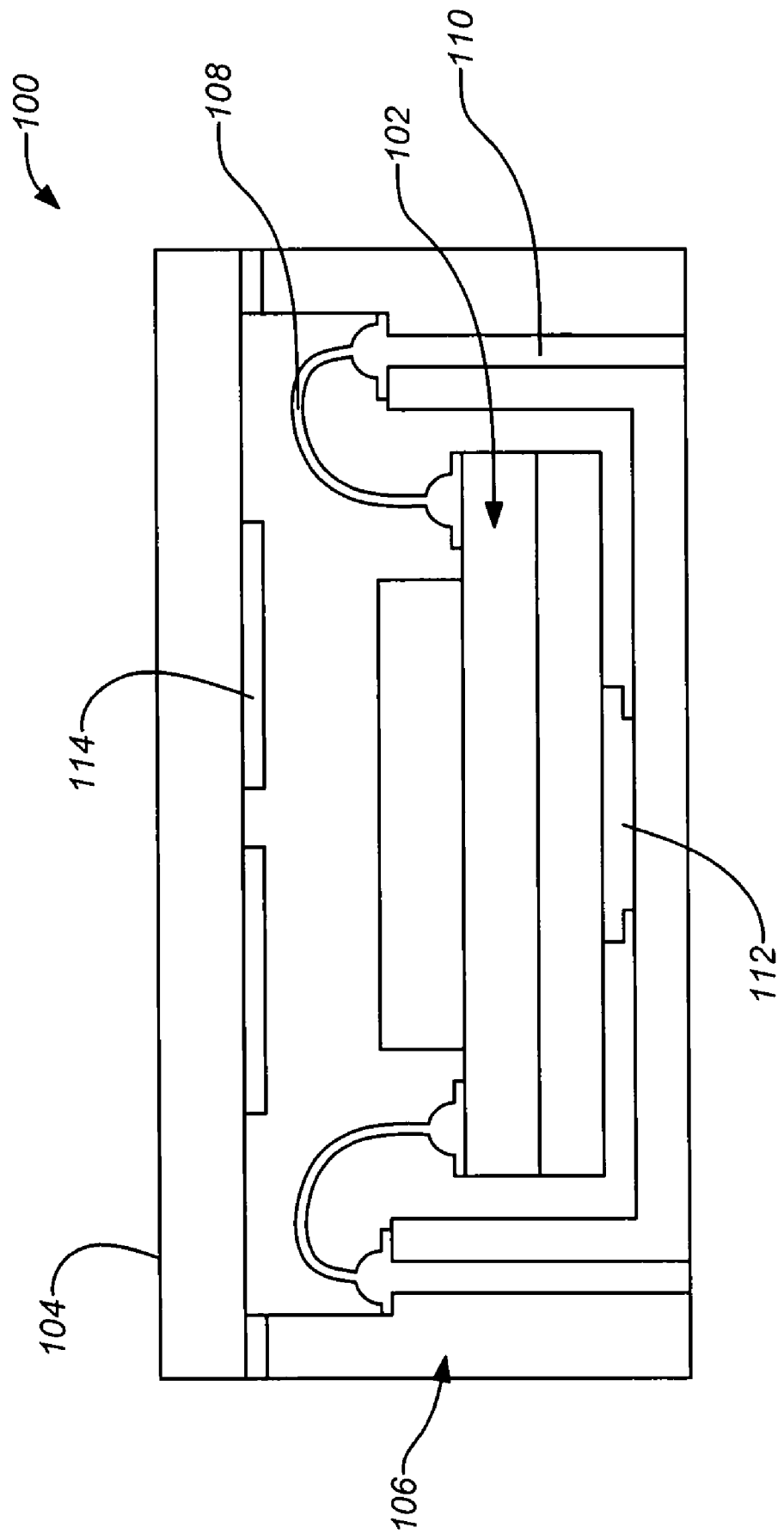
FIG. 1A illustrates a current disc resonator gyroscope (DRG) device.

FIG. 1A illustrates a current disc resonator gyroscope (DRG) assembly 100. Current DRGs have been realized using micromachining and ceramic leadless chip carrier (LCC) vacuum package 106 as shown. A typical assembly 100 includes a core DRG die 102, which comprises a three-layer silicon or quartz MEMS gyro chip enclosed in a ceramic LCC package 106, which provides a hermetic vacuum seal in order for the gyroscope to function properly. The LCC package may include a lid 104 bonded with a thermal compression bond to the remainder of the package 106. Wire leads 108 are attached between the DRG die 102 and the feedthroughs 110 in the package 106. The DRG die 102 is centrally bonded to the package 102 with a compression bond 112. In addition, the lid 104 of the package 106 includes a getter 114 to aid in forming the vacuum. For a detailed description of an exemplary current DRG assembly, see e.g. U.S. patent application Ser. No. 11/757,395 published as US Patent Application 2008-0295622A1, which is incorporated by reference herein.

Figure 1B:
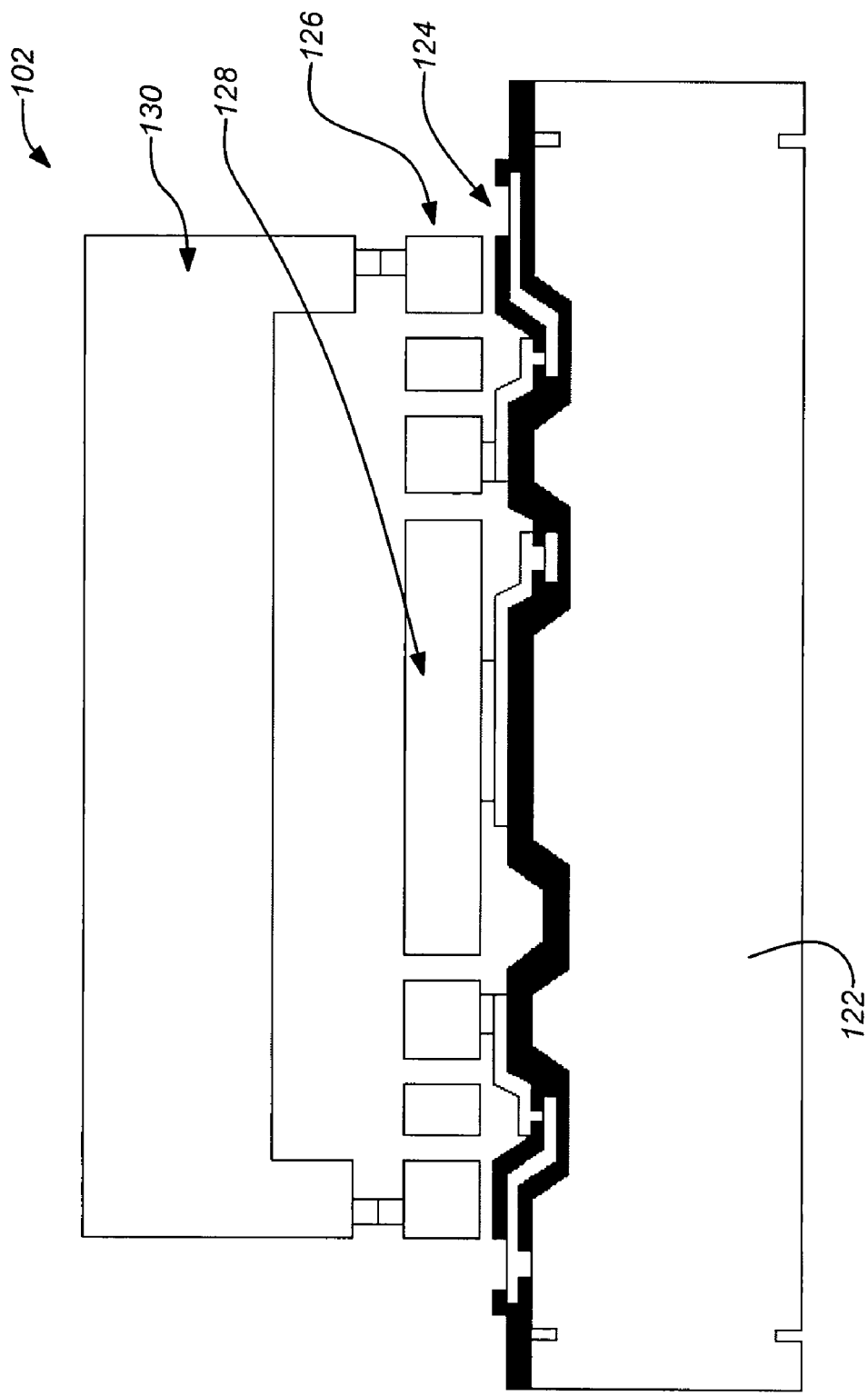
FIG. 1B is a schematic of the DRG chip for the current DRG assembly.

FIG. 1B is a schematic of the DRG chip for a current DRG die 102 as shown in FIG. 1A. The core DRG die 102 is a MEMS gyro chip including three discrete layers silicon or quartz, each separately micromachined, and then assembled together via gold-tin eutectic bond. The bottom electrode carrier layer 122 features CMOS electrodes 124 patterned onto it for driving, sensing, and biasing the active resonator capacitive electrode elements. It also provides structural support and electrical interfaces to the external package. The center DRG layer 126 includes the through-etched disc resonator 128. The top layer comprises the dust cover cap 130 to provide protection against damage during handling and testing. Typically, the dust cover cap 130 is permanently attached to the DRG, though the purpose is to keep the particles out during the assembly process. The dust cap is not typically bonded with a hermetic seal.

The die 102, once fabricated and diced, is then ready to be attached and sealed inside a standard LCC package. The die 102 is first bonded to the bottom of the LCC package 106 (see FIG. 1A), e.g. via a gold-tin eutectic bond with the gold-tin preform deposited in the center of the package 106. Once the die 102 is securely attached, it is wire bonded to the LCC feedthroughs 110 to provide the electrical interface. Finally, the lid 104, with pre-attached getter 114, is heated in vacuum to activate the getter, and then compressed against the package 106 to bond and form the final vacuum seal.

The conventional DRG assembly 100 (as described in FIGS. 1A & 1B), while providing an excellent vacuum package and a sufficient platform for performance demonstrations under laboratory conditions has limitations handling measurements in a real world environment. For example, the DRG assembly 100 has some high temperature sensitivity, non-repeatable turn-on bias, and some dynamic instability over time, which would may render the device inoperable over large temperature excursions. The cause of such instability with the DRG assembly 100 may be attributed to three major factors.

First, the DRG die is rigidly attached to the LCC package through the bonding of dissimilar materials. The area of the bonding pads encompasses about a ninth of the die's bottom surface, and is situated right beneath the active resonator. The inflexibility of the thermal compression bond, combined with large CTE mismatch and a large affected area, may induce high thermal mechanical stress and distortion both in the die and the LCC package. As a consequence the device may be very sensitive to temperature changes. Furthermore, any applied stress to the LCC may be transmitted through the rigid bond pad with little or no cushioning. This can cause high sensitivity to external stress or vibration.

Second, gold-tin eutectic bond and getter activation requires high processing temperatures, e.g. as high as 400° C. The rapid heating and cooling of rigidly bonded dissimilar materials over large temperature cycles during vacuum packing causes the bond pads to store a huge amount of residual stress. Depending on the magnitude of the residual stress, the bonded structure can exhibit moderate to highly unpredictable structural instability, which then manifest itself in the non-repeatability of turn on bias, and the random change in the sensor dynamics over time.

Third, the large bond pads are situated right beneath the active resonator. Its proximity to the resonator, with its large area, results in very high thermo conductivity to the central active layer. Hence any thermal sensitivity of the die itself will be enhanced by this short and highly conductive path.

Furthermore, the LCC vacuum sealing process for the DRG assembly 100 can be unreliable and expensive. In its development stage, the cost may be about 50% of the overall development cost, while device yield is less than 25%. It is projected, that in the production phase, an improved LCC encapulation with some environmental capability will cost about 80% of the overall device cost.

3. Novel Isolator for a MEMS Die

Figure 2A:
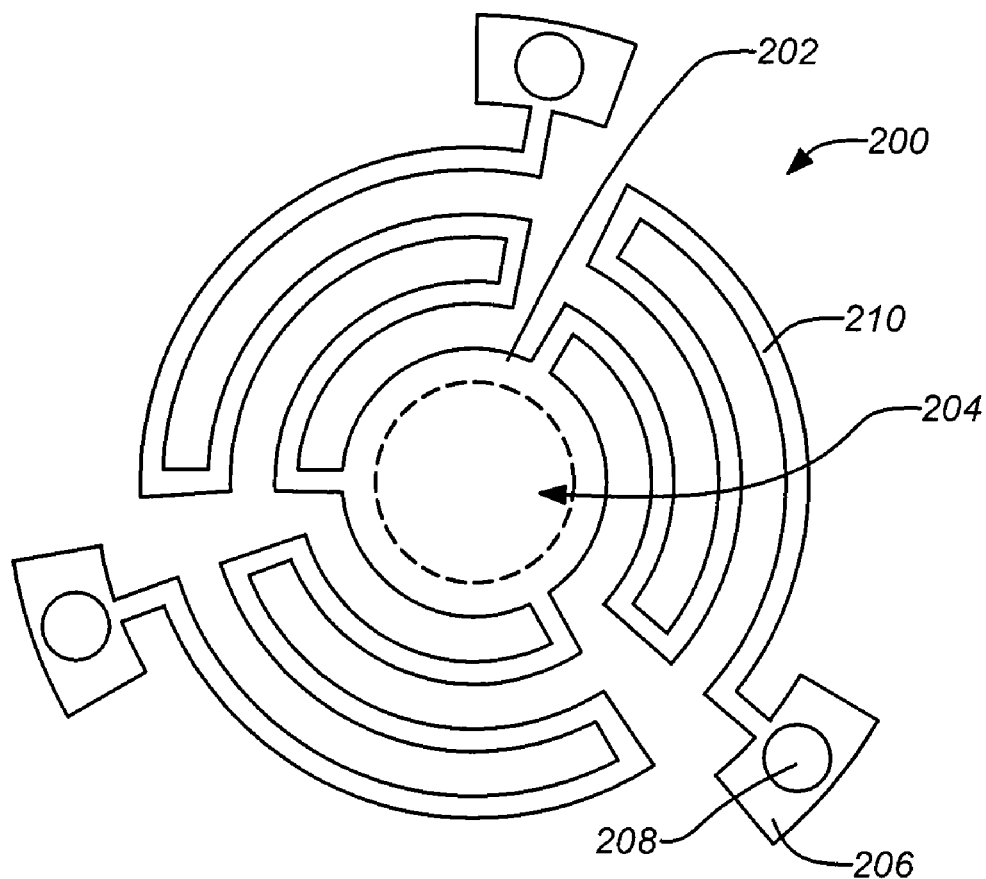
FIGS. 2A & 2B show a layout of an exemplary single layer isolator for a microelectromechanical system (MEMS) die.
Figure 2B:
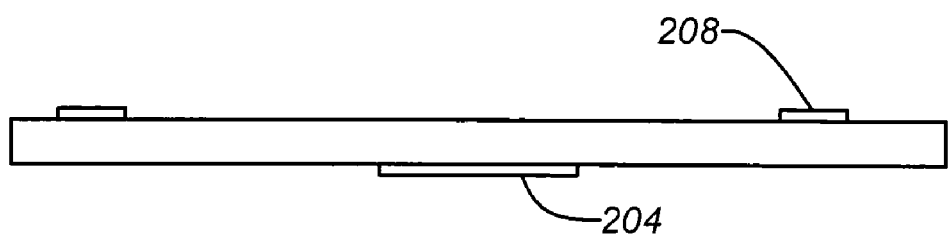

FIGS. 2A & 2B show a layout (top and side views, respectively) of an exemplary single layer 200 for an isolator for a semiconductor die (that may include a DRG). The single layer 200 includes a central region 202 that comprises a circular support. A gold-tin preform bond pad 204 on the underside may be used to bond to the vacuum package via a eutectic bond. The example single layer 200 also includes three radial symmetric pads 206 (referencing one example pad). The bond pads 206 are radial symmetric because they a laid out in a radial symmetric pattern with respect to the central region 202. Gold-tin bumps 208 (referencing one example bond bump) on each pad 206 may be used for attachment of the pads 206 to the DRG die via a eutectic bond. The three pads 206 are connected to the central region 202 via three thermal and mechanical isolation beams 210 (referencing one example isolation beam) in a spiral configuration as shown. Each isolation beam 210 is substantially radial, i.e. it is attached at the central region 202 at one end and the oppose end extends to an extended radial position. The path to the extended radial position may vary. In the example, each of the plurality of substantially radial top layer isolation beams comprises a plurality of circumferential segments and radial segments connected in series (e.g. four radial segments and three circumferential segments alternately interconnected in series).

Typically, a circular central region 202 with a pre-deposited gold bond pad 204 may be attached to the bottom of the vacuum package with a gold-tin preform. The single layer isolator 200 may employ three radial symmetric pads 206, each with pre-deposited gold bumps 208 to attach to the MEMS die through either a thermal compression bond or a eutectic bond. The example isolator 200 employs three radial symmetric thermal and mechanical isolation beams 210 in a spiral configuration to connect the central region 202 support radial symmetric pads 206 that attach to the MEMS die.

The overall dimension, diameter of the central region 202, and the size of the bond pads 204, 206, may be determined based on the size of the particular DGR MEMS die, e.g. 6 mm or 11 mm diameter. Clearance between the MEMS die, the isolator 200, and the vacuum package may be provided by the thickness of the gold-tin bonding bumps 208 and the central region bonding pad 204 as determined by the allowable vertical displacement. In addition, spacing between adjacent isolation beams 210 may be determined by the allowable lateral displacement and rotational displacement. Thickness of the isolator 200 may be determined by the size or mass of the applied MEMS die, and the available space within the vacuum package. For example, an 11 mm diameter DRG MEMS die may employ a thickness of approximately 200 μm. The isolation beam width is designed to provide vibration isolation for a particular frequency range, determined based on the mass of the MEMS die, the elasticity of the isolator material, and the operating environment. The single layer isolator 200 can be batch fabricated by through etching either silicon or fuse silica, with silicon the preferred material because of its superior mechanical strength.

The small bond pads that are attached to the periphery of the MEMS die reduce the effect of residual stress to the die. The isolator material may be selected to match that of the MEMS die in order to minimize CTE mismatch. Long thin isolation beams 210 can provide thermal isolation against external temperature changes, which may be conducted though the vacuum package. Weak and flexible isolation beams 210 can tolerate large displacements with very little resistance. Thus, any stress or distortion to the vacuum package, due to either CTE mismatch or external stress, may be absorbed by the isolator and will not be transmitted to the MEMS die. Beam rigidity is designed to provide attenuation to vibration of particular frequency range.

As will be described hereafter, the isolator may be readily inserted into an existing vacuum package in a single thermal compression bonding step, which is already present in the existing process. Thus, there may be no disruption to prior or subsequent processing steps, and neither does the addition of the isolator 200 affect the thermal budget of the manufacturing process.

In a typical embodiment of the disclosure, the MEMS die may comprise a disc resonator for a disc resonator gyroscope (DRG), having embedded electrostatic electrodes having sidewalls that interact with interior sidewalls of the disc resonator such that vibration modes of the disc resonator are driven and sensed with the embedded electrostatic electrodes to measure motion of the disc resonator, and a baseplate having a topside bonded to support the disc resonator and having electrical traces coupled from the embedded electrostatic electrodes and to a baseplate periphery. Structure and operation of the DRG is known, e.g. as described in U.S. Pat. Nos. 6,944,931, 7,347,095, 7,040,163, 7,401,397, 7,168,318, 7,285,844, 7,396,478, and 7,437,253 which are all incorporated by reference herein. Those skilled in the art will appreciate that embodiments of the present disclosure can be applied to benefit any known DRG design.

It should be noted that although the primary embodiment of the disclosure is described applied to a MEMS die that includes a disc resonator gyroscope (DRG), embodiment of the disclosure are not limited to this application. Those skilled in the art will appreciate the inventive concept is applicable to any MEMs device that may be especially sensitive to mechanical and thermal environments.

Figure 3A:
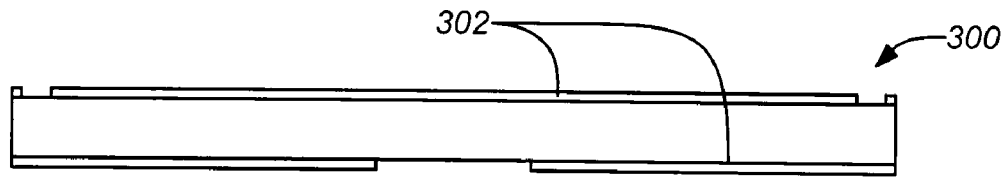
FIGS. 3A to 3F illustrate an exemplary process for producing a single layer isolator for a MEMS die.
Figure 3B:
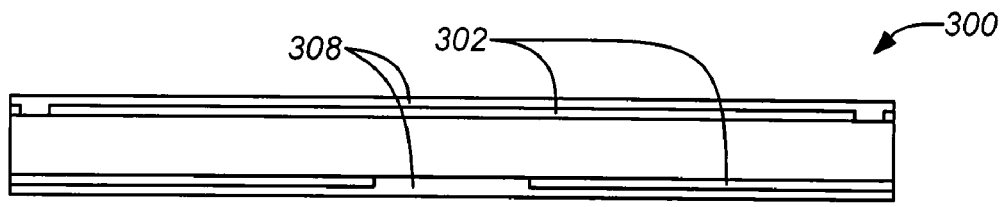
Figure 3C:
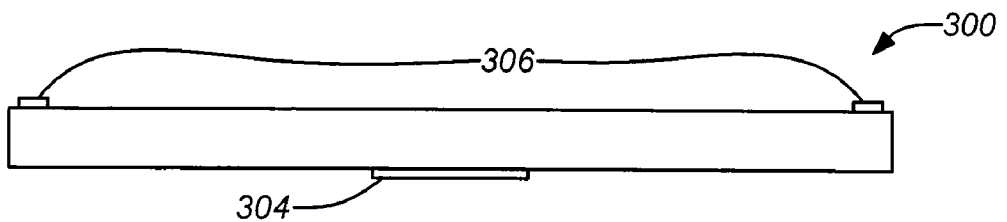
Figure 3D:
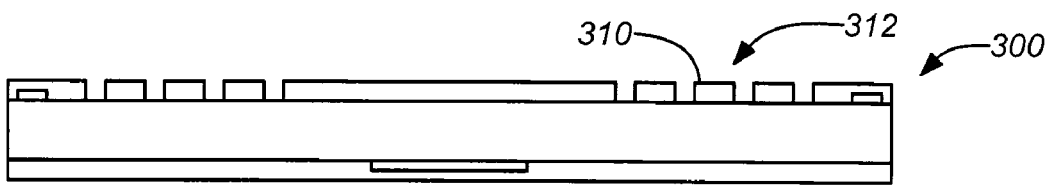
Figure 3E:
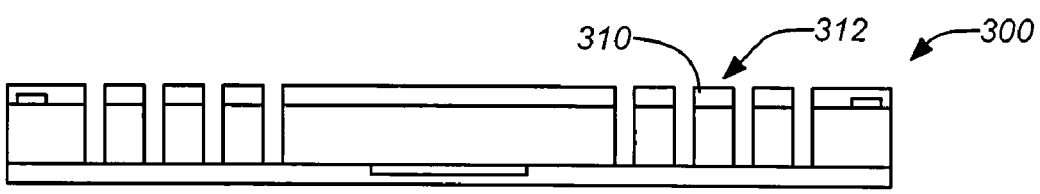
Figure 3F:
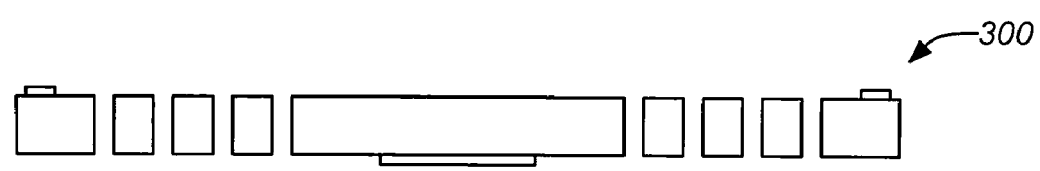

FIGS. 3A to 3F illustrate an exemplary process for producing a single layer 300 isolator for a MEMS die. FIG. 3A illustrates depositing photoresist 302 on both sides of the semiconductor layer 300 (e.g. silicon or fused silica) patterned with locations for the central region bond pad 304 and the package attachment support bond pads 306. FIG. 3B illustrates depositing an adhesion layer and then gold-tin perform layer 308, e.g. 5 μm thick. FIG. 3C illustrates liftoff of the excess gold-tin to form the pads 304, 306. FIG. 3D illustrates depositing photoresist 310 and patterning the isolation beam 312 geometry. FIG. 3E illustrates through etching to form the isolation beams 312. FIG. 3F illustrates removing the photoresist 310 and cleaning and dicing to yield the finished single layer 300 isolator. The single layer 300 isolator may be produced through known micromachining of silicon or fused silica wafers in batch processing as previously described.

Figure 4A:
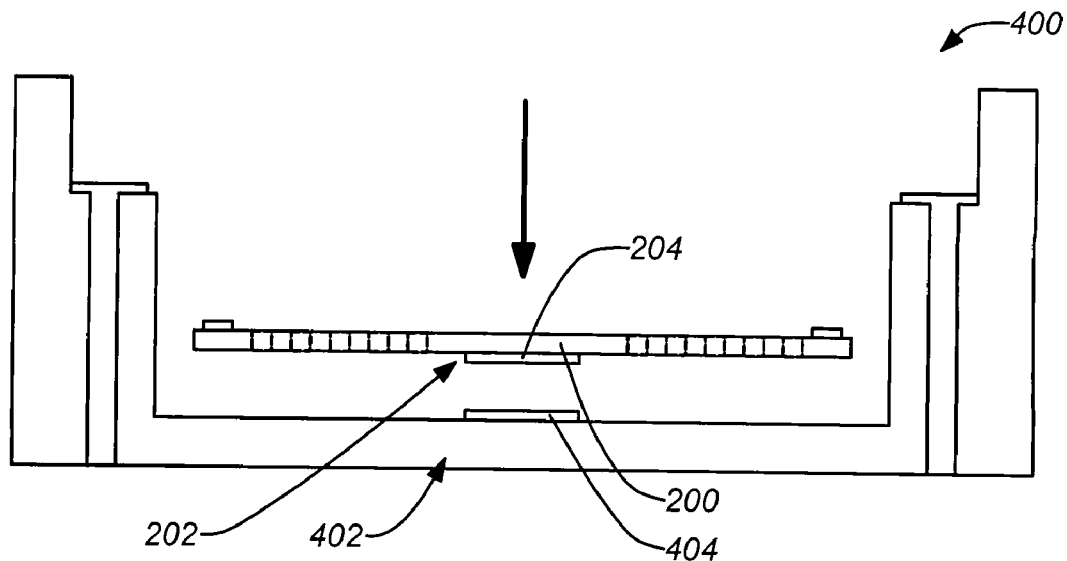
FIGS. 4A to 4C illustrate an exemplary process for integrating an exemplary isolator embodiment to isolate a MEMS die comprising a disc resonator for a DRG.
Figure 4B:
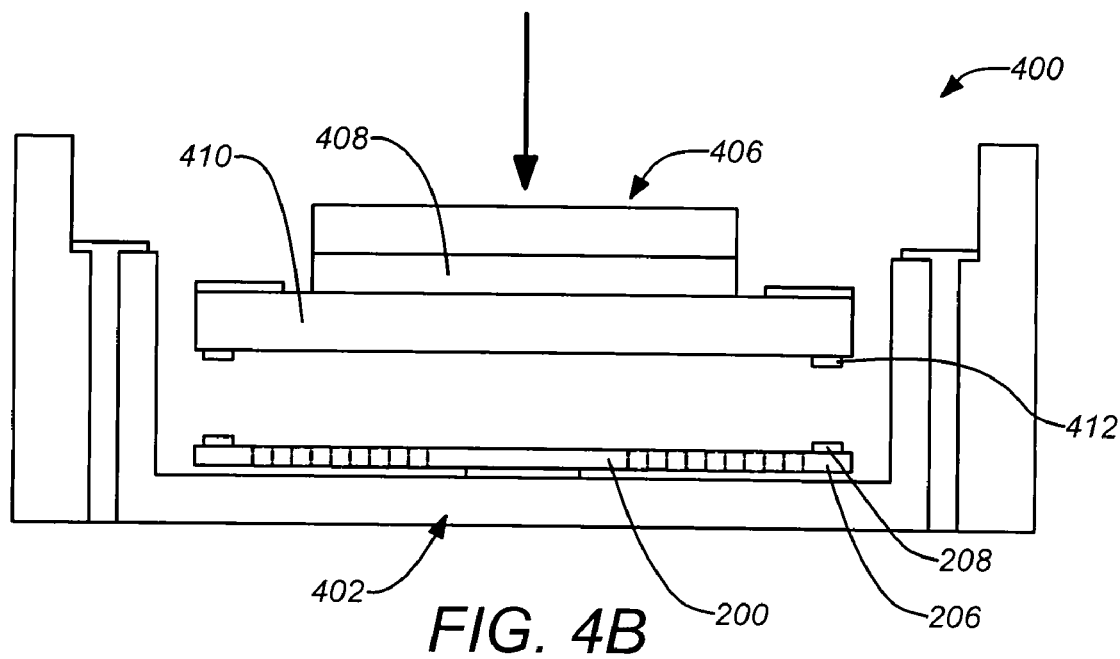
Figure 4C:
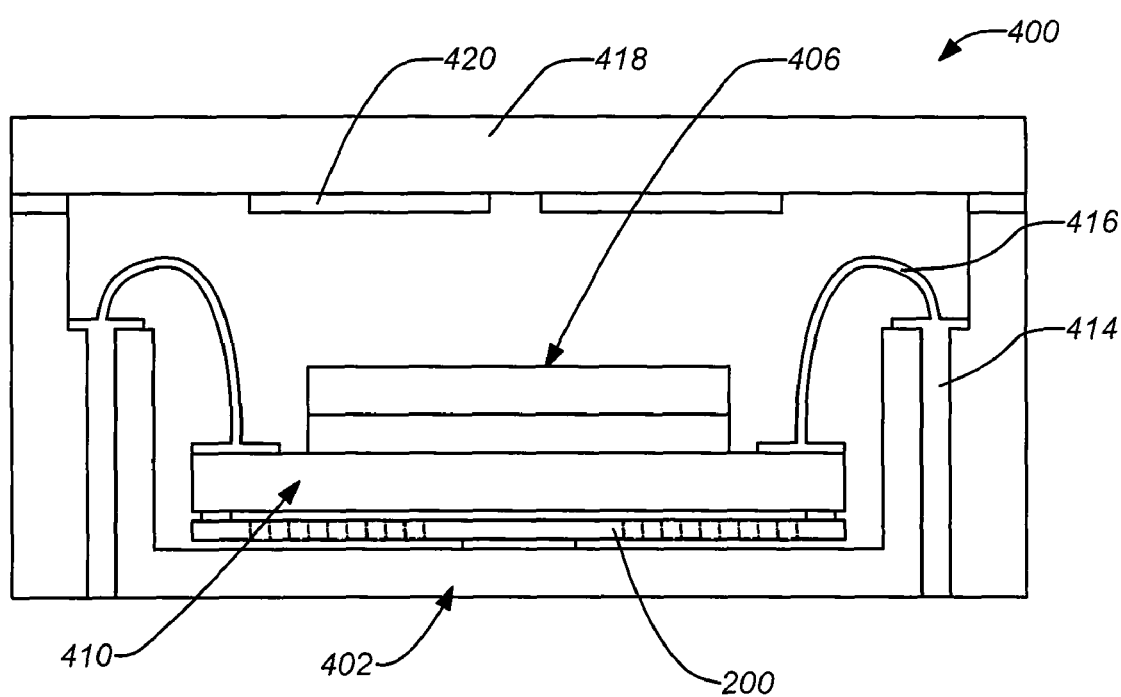

FIGS. 4A to 4C illustrate an exemplary process for integrating an exemplary isolator 200 embodiment to isolate a MEMS die comprising a disc resonator for a DRG 400. FIG. 4A illustrates the isolator assembly 200 (e.g. of FIGS. 2A & 2B) installed into the vacuum package 402 such that the bond pad 204 of the central region 202 of the isolator 200 is bonded to a bottom interior of the vacuum package 402 with matching bond pads 204, 404. FIG. 4B illustrates the MEMS die 406 that includes the disc resonator assembly 408 supported on a baseplate 410 that includes the electrical traces at the periphery to the embedded electrodes for operating the DRG as is known in the art. The periphery of the MEMS die 406 at matching bond pads 412 is bonded to the gold-tin bumps 208 on the separate radial symmetric pads 206 of the plurality of substantially radial isolation beams of isolator 200. FIG. 4C shows the finished DRG 400. The vacuum package 402 includes electrical feedthroughs 414 coupled to wire bonds 416 which are coupled in turn to the embedded electrodes on the baseplate 410 to operate the DRG 400 as is known in the art. The vacuum package 402 comprises a lid 418 including a getter material 420 activated to assist producing a vacuum within the vacuum package 402. The lid 418 is bonded to close out the vacuum package 402.

As shown, the isolator assembly 400 may be inserted between the MEMS die 406 and the LCC vacuum package 402 in a single eutectic bond process, replacing the conventional step to attach MEMS die 406 directly to the LCC package 402. (See e.g. FIGS. 1A & 1B.) Thus, there may be no disruption to prior or subsequent processing steps, nor does it affect the thermal budget of the process. As described, the small gold-tin bumps 208 that are bonded to the periphery of the MEMS die 406 can reduce the effect of residual stress to the MEMS die 406. The materials for the isolator 200 may be selected to match that of the MEMS die and minimize CTE mismatch.

Long thin isolation beams can provide thermal isolation against external temperature change, which may be conducted though the LCC package. Furthermore, employing weak and flexible isolation beams can enable tolerance of large displacements with very little resistance. Accordingly, any stress or distortion to the LCC package, due to either CTE mismatch or external stress, may be absorbed by the isolator and not transmitted to the disc resonator. As previously discussed, beam rigidity is designed to provide attenuation to vibration of particular frequency range.

It should be noted that the figures illustrating processing of the layers and assembly are intended to show only the operations of an exemplary detailed manufacturing process. The relative thicknesses of the various applied layers are not shown to scale as shall be appreciated by those skilled in the art.

4. Method of Producing an Isolator for a MEMS Die

Figure 5:
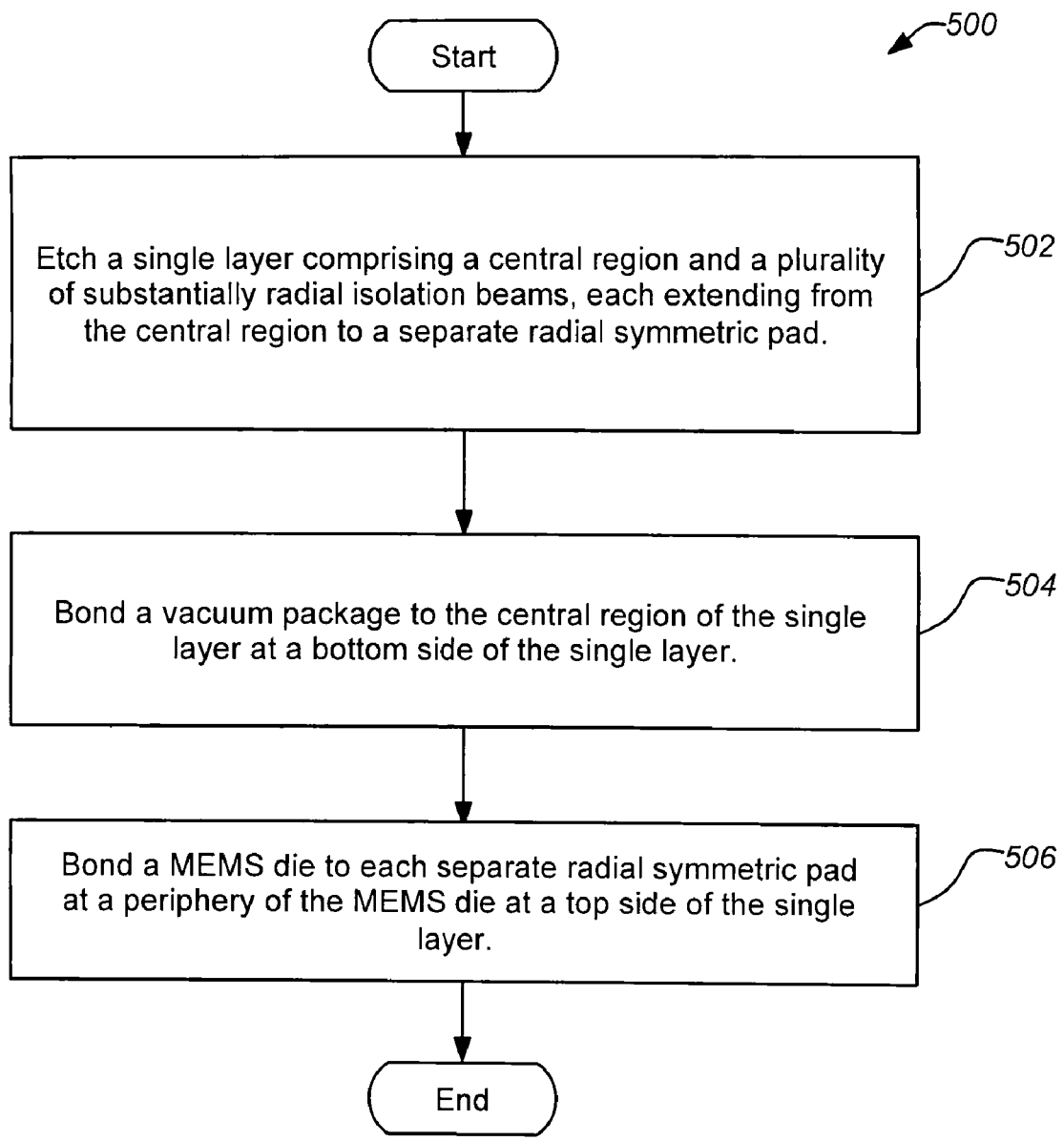
FIG. 5 is a flowchart of an exemplary method of producing an isolator embodiment of the disclosure.

FIG. 5 is a flowchart of an exemplary method 500 for producing an isolator for a MEMS die. The method 500 includes an operation 502 of etching a single layer comprising a central region and a plurality of substantially radial isolation beams, each extending from the central region to a separate radial symmetric pad. In operation 504, a vacuum package is bonded to the central region of the single layer at a bottom side of the single layer. In operation 506, a MEMS die is bonded to each separate radial symmetric pad at a periphery of the MEMS die at a top side of the single layer. The method 500 may be further enhanced through optional operations in order to develop the apparatus embodiments described in the foregoing sections.

This concludes the description including the preferred embodiments of the present invention. The foregoing description including the preferred embodiments of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concept as set forth in the following claims.

What is claimed is:

1. A method of producing an isolator for a microelectromechanical system (MEMS) die, comprising:
   etching a single layer comprising a central region and a plurality of substantially radial isolation beams, each extending from the central region to a separate radial symmetric pad;
   bonding a vacuum package to the central region of the single layer at a bottom side of the single layer; and
   bonding a MEMS die comprising a baseplate supporting a MEMS device to each separate radial symmetric pad at a periphery of the baseplate of the MEMS die at a top side of the single layer.

2. The method of claim 1, wherein each of the plurality of substantially radial isolation beams comprises a plurality of circumferential segments and radial segments connected in series.

3. The method of claim 2, wherein each of the plurality of substantially radial isolation beams includes three circumferential segments and four radial segments alternately interconnected in series.

4. The method of claim 3, wherein there are three substantially radial isolation beams.

5. The method of claim 1, wherein beam width of the substantially radial top layer isolation beams is selected to provide vibration isolation.

6. The method of claim 1, wherein there are three substantially radial isolation beams.

7. The method of claim 1, wherein the MEMS device of the MEMS die comprises a disc resonator having embedded electrostatic electrodes having sidewalls that interact with interior sidewalls of the disc resonator such that vibration modes of the disc resonator are driven and sensed with the embedded electrostatic electrodes to measure motion of the disc resonator; and
   the baseplate has a topside bonded to support the disc resonator and electrical traces coupled from the embedded electrostatic electrodes and to a periphery of the baseplate;
   wherein a bottom side of the baseplate is bonded to the separate radial symmetric pad of each of the plurality of substantially radial isolation beams.

8. The method of claim 7, wherein the vacuum package comprises electrical feedthroughs where the electrical feedthroughs are coupled to wire bonds that are coupled in turn to the electrical traces at the baseplate periphery.

9. The method of claim 8, wherein the vacuum package comprises a lid including a getter material activated to assist producing a vacuum within the vacuum package and the lid is bonded to close out the vacuum package.

10. The method of claim 1, wherein the single layer comprises a semiconductor material selected from the group consisting of silicon and fused silica.

* * * * *